United States Patent
La Torre et al.

(10) Patent No.: US 11,048,178 B2
(45) Date of Patent: Jun. 29, 2021

(54) LITHOGRAPHIC APPARATUS WITH IMPROVED PATTERNING PERFORMANCE

(71) Applicant: ASML NETHERLANDS B.V., Veldhoven (NL)

(72) Inventors: Federico La Torre, Eindhoven (NL); Laurentius Johannes Adrianus Van Bokhoven, Veldhoven (NL); José Nilton Fonseca, Jr., Eindhoven (NL); Gerben Pieterse, Eindhoven (NL); Erik Henricus Egidius Catharina Eummelen, Veldhoven (NL); Frank Johannes Jacobus Van Boxtel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/772,444

(22) PCT Filed: Nov. 22, 2018

(86) PCT No.: PCT/EP2018/082184
§ 371 (c)(1),
(2) Date: Jun. 12, 2020

(87) PCT Pub. No.: WO2019/115196
PCT Pub. Date: Jun. 20, 2019

(65) Prior Publication Data
US 2020/0393769 A1  Dec. 17, 2020

(30) Foreign Application Priority Data

Dec. 14, 2017 (EP) ..................................... 17207390
Mar. 28, 2018 (EP) ..................................... 18164526

(51) Int. Cl.
*G03F 7/20* (2006.01)

(52) U.S. Cl.
CPC ...... *G03F 7/70875* (2013.01); *G03F 7/70358* (2013.01); *G03F 7/70725* (2013.01); *G03F 7/70775* (2013.01); *G03F 7/70933* (2013.01)

(58) Field of Classification Search
CPC ............. G03F 7/70875; G03F 7/70916; G03F 7/70358; G03F 7/70725; G03F 7/70775;
(Continued)

(56) References Cited

U.S. PATENT DOCUMENTS 6,952,253 B2   10/2005   Lof et al.
7,489,389 B2    2/2009   Shibazaki
(Continued)

FOREIGN PATENT DOCUMENTS

JP        6295056       2/2018
WO     2014128232       8/2014
(Continued)

OTHER PUBLICATIONS

International Search Report and Written Opinion issued in corresponding PCT Patent Application No. PCT/EP2018/082184, dated Mar. 14, 2019.

*Primary Examiner* — Steven Whitesell Gordon
(74) *Attorney, Agent, or Firm* — Pillsbury Winthrop Shaw Pittman LLP

(57) ABSTRACT

A plate to be positioned between a movable stage and a projection system of a lithographic apparatus, the plate having a surface to face the movable stage; an opening through the plate for passage of patterned radiation beam; one or more gas outlets in a side of the opening and in the surface of the plate, wherein the one or more gas outlets are configured to supply gas to a region between the movable stage and the projection system, wherein all of the one or more gas outlets in the surface of the plate are positioned such that, for each of such one or more gas outlets, a line that (Continued)

is both orthogonal to the surface and intersects the gas outlet does not intersect the patterning device at any point during the entire range of movement of the patterning device.

20 Claims, 9 Drawing Sheets

(58) Field of Classification Search
CPC .............. G03F 7/70933; G03F 7/70866; G03F 7/70883
See application file for complete search history.

(56) References Cited

U.S. PATENT DOCUMENTS

| | | |
|---|---|---|
| 2002/0045113 A1 | 4/2002 | Pril et al. |
| 2002/0057422 A1* | 5/2002 | Arakawa ............ G03F 7/70933 355/30 |
| 2003/0006380 A1 | 1/2003 | Van Empel et al. |
| 2004/0125354 A1 | 7/2004 | Hibbs |
| 2004/0212791 A1 | 10/2004 | De Bokx et al. |
| 2005/0140949 A1 | 6/2005 | Jasper et al. |
| 2011/0032495 A1 | 2/2011 | Shibazaki |
| 2011/0228239 A1 | 9/2011 | Gosen et al. |
| 2015/0168854 A1* | 6/2015 | Westerlaken ....... G03F 7/70875 355/30 |
| 2015/0241796 A1* | 8/2015 | Ebert, Jr. ............ G03F 7/70808 355/30 |
| 2015/0355557 A1* | 12/2015 | Cuypers .............. G03F 7/70725 355/72 |
| 2017/0068175 A1 | 3/2017 | Westerlaken et al. |

FOREIGN PATENT DOCUMENTS

| | | |
|---|---|---|
| WO | 2016169727 | 10/2016 |
| WO | 2017092986 | 6/2017 |

* cited by examiner

Position A

Position B

Position C

LITHOGRAPHIC APPARATUS WITH IMPROVED PATTERNING PERFORMANCE

CROSS-REFERENCE TO RELATED APPLICATIONS

This application is the U.S. national phase entry of PCT Patent Application No. PCT/EP2018/082184, which was filed on 22 Nov. 2018, which claims the benefit of priority of European Patent Application No. 17207390.0 which was filed on 14 Dec. 2017 and of European Patent Application No. 18164526.8 which was filed on 28 Mar. 2018. Both applications are incorporated herein in their entireties by reference.

FIELD

The present invention relates to techniques for improving the performance of a patterning device of a lithographic apparatus. In particular, embodiments provide techniques for reducing errors that are caused by the gas flows around the patterning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Any disturbances of the patterning device, and in the optical path through the patterning device, increase overlay error and should therefore be minimised.

SUMMARY

According to an aspect of the invention, there is provided a lithographic apparatus comprising: a movable stage comprising a support structure configured to support a patterning device; a projection system configured to project a patterned radiation beam onto a target portion of a substrate; and a plate positioned between the movable stage and the projection system; wherein the plate comprises: a first surface that faces the movable stage; a second surface that faces the projection system; an opening through the plate such that the patterned radiation beam passes through the opening, wherein the opening has at least a first side and a second side that extend from the first surface to the second surface; one or more gas outlets in the first side of the opening and one or more gas outlets in the first surface of the plate, wherein the gas outlets are configured such that gas is supplied, via the gas outlets, to a region between the movable stage and the projection system; one or more gas inlets in the second side of the opening, wherein the gas inlets are configured such that gas is extracted from the region between the movable stage and the projection system via the gas inlets; and all of the one or more gas outlets in the first surface of the plate are positioned and configured such that, for each of the one or more gas outlets, a line that is both orthogonal to the first surface and intersects the gas outlet does not intersect the patterning device at any point during the entire range of movement of the patterning device.

Preferably, the patterning device comprises a patterned part and a pellicle, wherein the pellicle is arranged between the patterned part and the plate.

Preferably, one or more gas outlets are provided in the second surface of the plate.

Preferably, the second side of the opening is opposite the first side of the opening.

Preferably, the first side and the second side of the opening are arranged so that a direct flow path of gas from the first side to the second side is parallel to the movement direction of the movable stage.

Preferably, the lithographic apparatus further comprises one or more valve systems arranged to control of the flow of gas through the gas outlets and/or one or more gas inlets; one or more fan systems arranged to cause a gas flow into the one or more gas inlets; and one or more control systems arranged to control the one or more valve systems and/or one or more fan systems so as to control the gas flows through the gas outlets and one or more gas inlets.

Preferably, the one or more control systems are configured to control the gas flows such that the rate of gas flow out of the one or more gas outlets in the first side of the opening is more than the rate of gas flow into the one or more gas inlets in the second side of the opening such that: a first proportion of the gas that flows out of the one or more gas outlets in the first side of the opening flows directly to the one or more gas inlets in the second side of the opening in a flow path that is substantially orthogonal to the direction of the patterned radiation beam through the opening; and a second proportion of the gas that flows out of the one or more gas outlets in the first side of the opening flows towards the first surface.

Preferably, the one or more control systems are configured to control the gas flows such that the rate of gas flow out of the one or more gas outlets in the first side of the opening is greater than the rate of gas flow into the one or more gas inlets in the second side of the opening; and the ratio of the first proportion to the second proportion is between 0.99:0.01 and 0.5:0.5. Preferably, the gas flow is controlled such that at least some of the gas flow towards the first surface is arranged to regulate the temperature of the pellicle.

Preferably, the first surface is substantially planar.

Preferably, along an axis parallel to the direction of the patterned radiation beam through the opening, the length of the first side of the opening is less than the length second side of the opening.

Preferably, the separation between the first side and the second side of the opening on the first surface of the opening is less than the separation between the first and second sides of the opening on the second surface of the opening.

Preferably, the one or more gas outlets in the first surface comprise elongate slits.

Preferably, the slits are arranged such that one or more of the slits are substantially parallel to the direction of movement of the movable stage.

Preferably, the one or more control systems are configured to generate: a first rate of gas flows out of the gas outlets and into the one or more gas inlets when the apparatus is used for sensor measurements; and a second rate of gas flows out of the gas outlets and into the one or more gas inlets when the apparatus is used for scanning and exposure; wherein the first rate of gas flows is different from the second rate of gas flows.

Preferably, the plate comprises a fluid channel running through the plate, the fluid channel configured to carry a thermally conditioned fluid for temperature regulation of the plate.

Preferably, the first side of the opening further comprises one or more gas inlets.

Preferably, the one or more gas inlets in the first side are provided between the first surface and the one or more gas outlets in the first side.

Preferably, the first side and the second side of the opening are rounded.

Preferably, the first side of the opening comprises a first section and a second section; wherein, along an optical path from the patterning device to the projection system, the width of the opening along the first section decreases and the width of the opening along the second section increases.

Preferably, the second side of the opening comprises a first section and a second section; wherein, along the optical path from the patterning device to the projection system, the width of the opening along the first section decreases and the width of the opening along the second section increases.

Preferably, the gas outlets in the first side of the opening are provided in the second section of the first side of the opening; and the gas inlets in the first side of the opening are provided in the first section of the first side of the opening.

Preferably, the gas inlets in the second side of the opening are provided in the first section of the second side of the opening only.

Preferably, for the first side and/or the second side of the opening: the corners between the first surface and each first section are rounded; and/or the corners between each first section and each second section are rounded; and/or the corners between each second surface the second surface are rounded.

Preferably, the width of the opening at the first surface is between 10% and 70% larger than the minimum width of the entire opening through the plate.

According to a second aspect of the invention, there is provided a lithographic apparatus comprising: a movable stage comprising a support structure configured to support a patterning device; a projection system configured to project a patterned radiation beam onto a target portion of a substrate; and a plate positioned between the movable stage and the projection system; wherein the movable stage further comprises: a first elongate bar that is positioned adjacent to a first side of the patterning device and arranged to shield the patterning device; a second elongate bar that is positioned adjacent to a second side of the patterning device and arranged to shield the patterning device, wherein the second side of the patterning device is opposite the first side of the patterning device; the first bar and the second bar are arranged such that their longitudinal axis is orthogonal to both the direction of movement of the patterning device and an optical path of a radiation beam through the patterning device; along the length of each of the first bar and the second bar is a leading edge that faces substantially away from the patterning device and a trailing edge that faces substantially towards the patterning device; and the leading edge and/or the trailing edge of the first bar and/or the second bar has an aerodynamic shape.

Preferably, the trailing edge of the first bar and/or the second bar is tapered.

Preferably, the leading edge and/or the trailing edge of the first bar and/or the second bar is rounded.

Preferably, the trailing edge of the first bar and/or the second bar is pointed.

Preferably, the movable stage comprises: a first support structure arranged to support the first bar; a second support structure arranged to support the second bar; an opening between the first support structure and the first bar such that gas can flow between the first bar and the first support structure; and an opening between the second support structure and the second bar such that gas can flow between the second bar and the second support structure.

Preferably, the surface of the first bar and/or the second bar is curved.

Preferably, in a cross-section that is orthogonal to the longitudinal axis of the first bar and/or the second bar, the bar is substantially symmetric.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
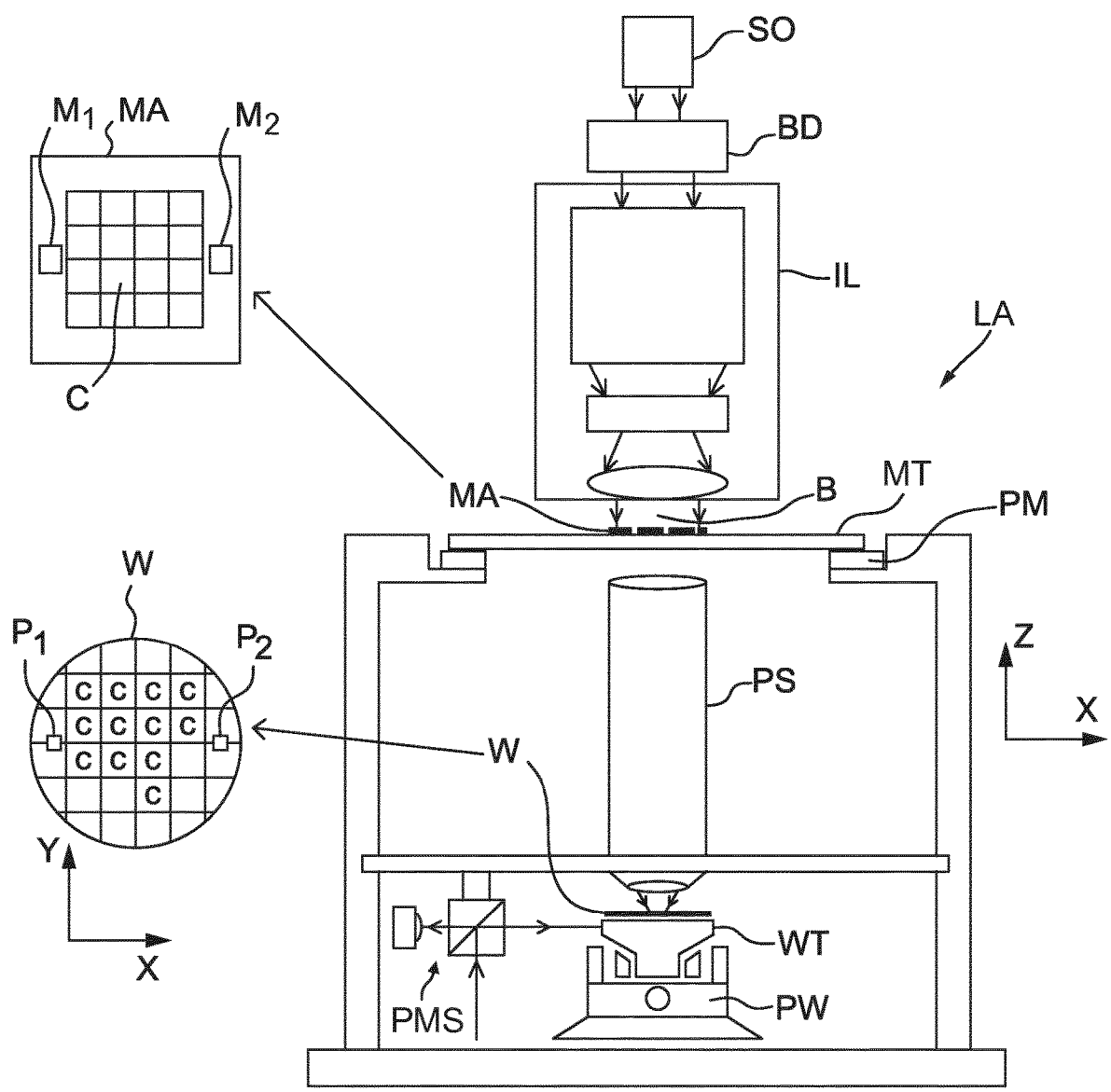
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g. a mask support/table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. The support structure MT is a moveable stage and the position of the support structure MT is controlled by the first positioner PM.

In operation, the illumination system IL receives a radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus LA, for example a part of the projection system PS or a part of a system that provides the immersion liquid. The measurement stage may move beneath the projection system PS when the substrate support WT is away from the projection system PS.

In operation, the radiation beam B is incident on the patterning device MA, e.g. mask, which is held on a support structure MT and is patterned by the pattern (design layout) present on patterning device MA. Having traversed the patterning device MA, the radiation beam B passes through the projection system PS, which focuses the radiation beam B onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axes is orthogonal to the other two axis. A rotation around the x-axis is referred to as an Rx-rotation. A rotation around the y-axis is referred to as an Ry-rotation. A rotation around the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention.

Figure 2:
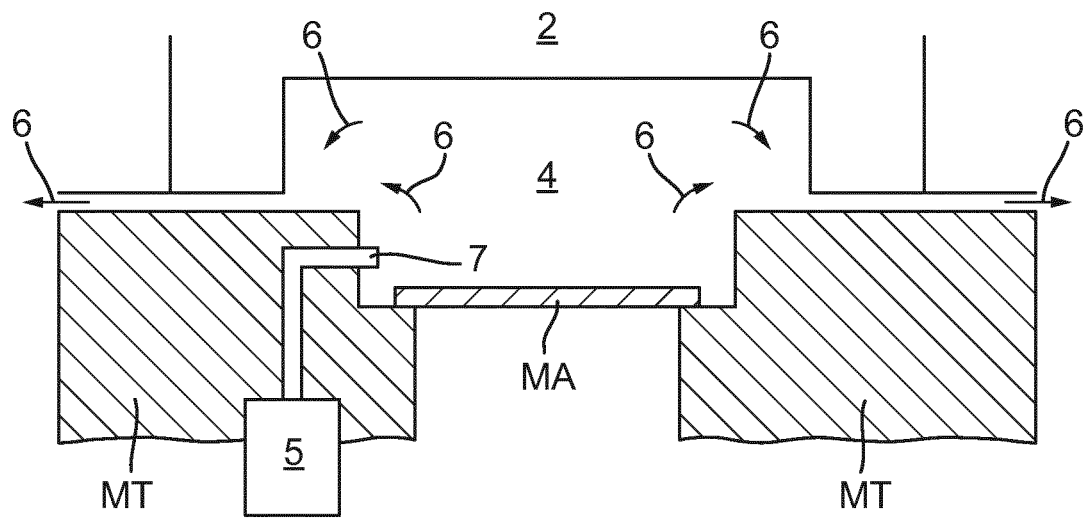
FIG. 2 depicts components around a patterning device of a lithographic apparatus.

FIG. 2 depicts an arrangement, depicting in general how control of an internal gaseous environment 4 can be achieved in a region above, for example, the support structure MT. It should be appreciated that such an internal gaseous environment may desirably also be provided in other parts of a lithographic apparatus LA, for example in the region of the substrate support WT, or a part thereof. For example, it may be desirable to control a gaseous environment around a sensor such as a position sensor. It will be appreciated that an embodiment of the invention described herein may therefore be used in such other contexts, namely is not limited to the contexts used herein to describe an embodiment of the invention.

The internal gaseous environment 4 in this example is located between the patterning device MA and the support structure MT on one side, and a final element (and surrounding hardware) 2 of the illumination system IL on the other side. The internal gaseous environment 4 depicted is thus a volume through which the radiation beam B will pass before it encounters the patterning device MA.

In this example, a gas supply system 5 is provided to supply gas via an outlet 7 to the internal gaseous environment 4. The gas may be supplied with a controlled composition and/or at a controlled flow rate. Optionally, an overpressure is maintained within the internal gaseous environment 4. The overpressure results in an outward flow of gas, as shown schematically by arrows 6. The gas supply system 5 and/or outlet 7 may be mounted within the support structure MT (as shown) and/or within an element above and/or below the support structure MT. For example, the gas supply system 5 and/or outlet 7 may be mounted within the final element 2 of the illumination system IL. Alternatively or additionally, the gas supply system 5 and/or outlet 7 may be mounted within a first element 3 of the projection system PS.

Figure 3:
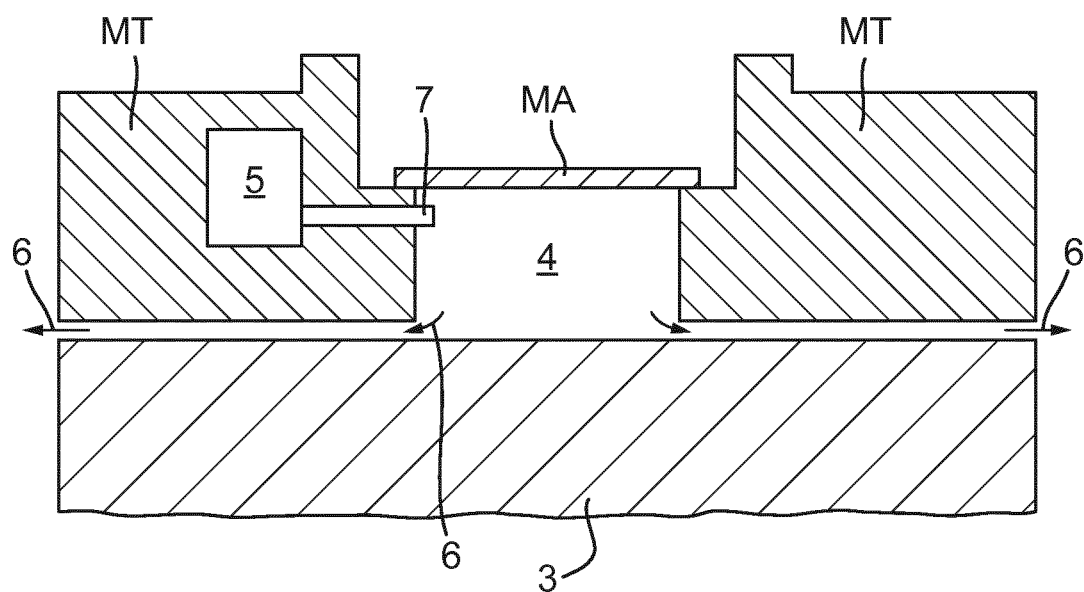
FIG. 3 depicts components around a patterning device of a lithographic apparatus.

FIG. 3 depicts an arrangement corresponding to the arrangement of FIG. 2 except that the internal gaseous environment 4 is located below the patterning device MA. The internal gaseous environment 4 depicted is thus a volume through which the radiation beam will pass after it has encountered the patterning device MA. The internal gaseous environment 4 is contained by the support structure MT and patterning device MA on one side and by a first element (and surrounding hardware) 3 of the projection system PS on the other side.

The internal gaseous environments 4 of FIGS. 2 and 3 are shown in separate locations. However, in an embodiment, the internal gaseous environments 4 are not isolated from each other. The internal gaseous environments 4 could be connected together. In this case, a single gas supply system 5 could be provided. The single gas supply system 5 could have a single outlet 7 either above or below the patterning device MA. Gas would be able to flow between the internal gaseous environment 4 above the patterning device MA and the internal gaseous environment 4 below the patterning device MA by one or more connections between the internal gaseous environment 4 above the patterning device MA and the internal gaseous environment 4 below the patterning device MA. Alternatively, the single gas supply system 5 could have a plurality of outlets 7 below, above, or below and above the patterning device MA.

In the example shown, the gas supply system 5 and outlet 7 are incorporated into the support structure MT. However, the gas supply system 5 and/or outlet 7 could be mounted to other components. For example, the gas supply system 5 and/or outlet 7 could be attached to the final element (or surrounding hardware) 2 of the illumination system IL and/or the first element (or surrounding hardware) 3 of the projection system PS.

Figure 4:
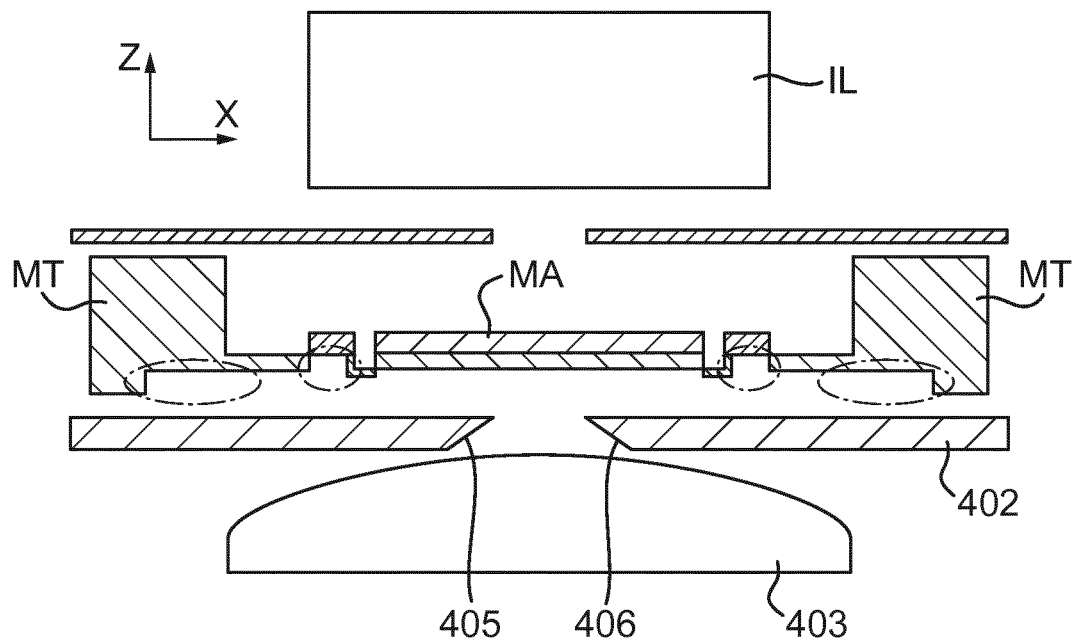
FIG. 4 depicts components around a patterning device of a lithographic apparatus.

FIG. 4 illustrates a cross-sectional view of an known implementation of a patterning device MA, and the components around the patterning device MA, in a lithographic apparatus LA.

The components around the patterning device MA include the support structure MT and a plate 402, which may be referred to as an Lens Top Environment (LTE) plate. Also shown in FIG. 4 is the top of an optical element 403, such as a lens top 403, of the projection system. The LTE volume is the region between the support structure MT and lens top 403 in which gasses can flow.

The support structure MT is a moveable stage and may be coupled to an actuating device, e.g., a short stroke actuator, long stroke actuator or a combination thereof.

The plate 402 comprises an opening with a first sidewall 405 and a second sidewall 406. As shown in FIG. 4, the sidewalls 405 and 406 are slanted. There is an optical path from the illumination system IL, through the patterning device MA, through the opening and into the projection system PS.

In an example, plate 402 may be configured as a purge plate that comprises a source of purge gas for purging the LTE volume. The purge gas ensures that the LTE volume is a conditioned gas-environment through which imaging radiation may travel from the illumination system IL to the lens top 403. Turbulent gas flows can be caused in the LTE volume by, e.g., temperature gradients and/or pressure waves induced by moving parts of the lithographic apparatus LA.

The flow of purge gas into the LTE volume may be a continuous gas flow supplied through openings on one of the sidewalls. The purge gas may also be extracted from the LTE volume through openings on the opposite sidewall to that through which the purge gas is supplied. Due to the slanted geometry of sidewalls 405 and 406, vertical flow components parallel to an optical axis of illumination system IL may be present in the continuous flow of gas. The presence of vertical flow components may create a gas flow pattern in the LTE volume that is not substantially perpendicular to an optical axis of illumination system IL. Such gas flow patterns in the part of LTE volume beneath support structure MT may contribute to chaotic and unsteady gas flow during a scanning operation. This increases the overlay errors, e.g., non-moving average overlay errors. Non-moving average overlay error is an overlay component that is sometimes defined as the scanner-filter residual; in essence a noise that remains after row-based filtering. It may be associated with local overlay effects, or intra-field overlay performance. In one example, non-moving average overlay errors are attributed to variations in exposure fields or exposure rows. Additionally, or alternatively, the errors may be caused by alignment noise.

Figure 5A:
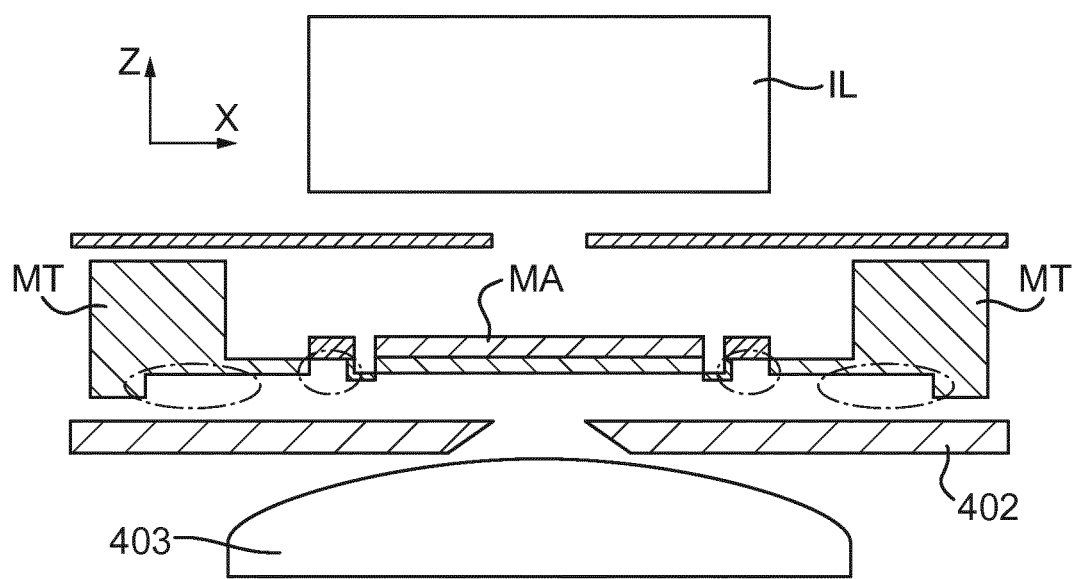
FIGS. 5A to 5C depict the movement of a support structure of a patterning device during a scanning operation.
Figure 5B:
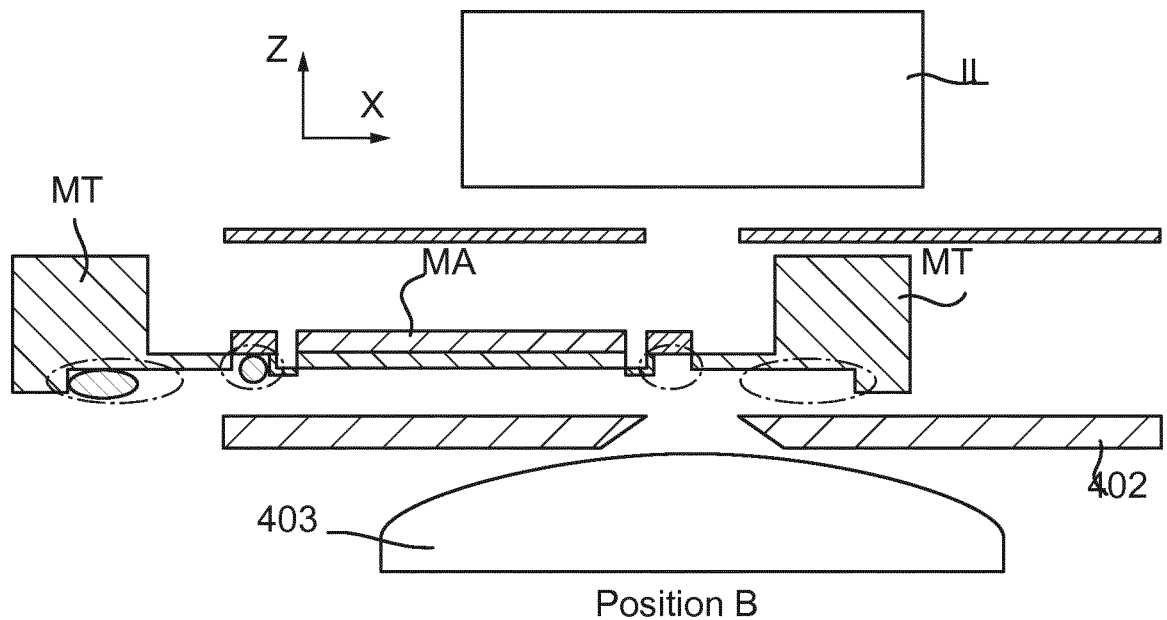
Figure 5C:
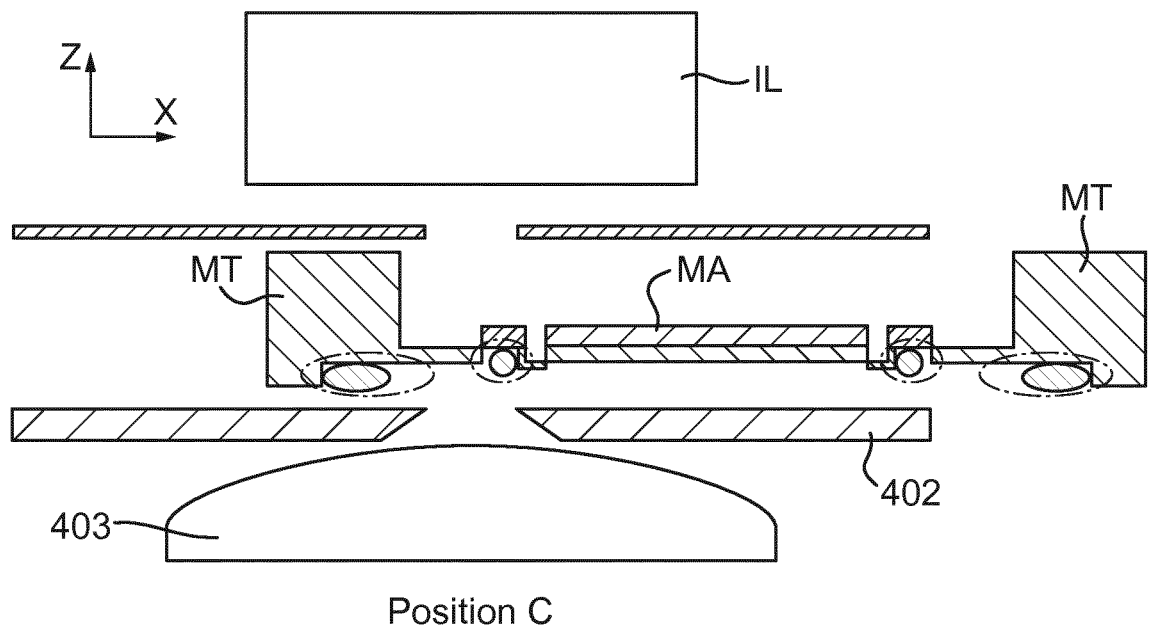

Additionally or alternatively, a non-flat geometry of a bottom surface of support structure MT may also contribute to the non-moving average overlay errors. As illustrated in FIG. 4 and FIGS. 5A to 5C, the non-flat bottom surface of support structure MT may have cavities (shown with dot-dash lines), which contribute to the non-moving average overlay errors. Cavities may carry and transport non-conditioned gas around the LTE volume during the scanning of support structure MT along X-axis, as illustrated in FIGS. 5A to 5C. It should be noted that support structure MT may also scan along Y-axis, even though this is not illustrated in the present disclosure. FIG. 5B illustrates that support structure MT may take non-conditioned gas into the cavities from a distant environment when the support structure MT scans from position A to B. This non-conditioned gas may then be transported into the part of LTE volume where the opening in plate 402 is (as shown in FIG. 5C) when support structure MT scans from position B to C. As this non-conditioned gas has a refractive index different from the conditioned gas, i.e. purge gas, provided between support structure MT and lens top 403, the imaging radiation beam B may experience a varying optical path length while traversing from illumination system IL towards lens top 403, which may lead to non-moving average overlay errors. The non-conditioned gas also contaminates the part of the LTE volume through which the radiation beam B passes. Additionally, the gas carried within the cavities may cause turbulence in the gas flow in the LTE volume, resulting in unsteady gas flow and non-uniform temperature distribution in the LTE volume.

The following known modifications to the above-described techniques reduce the non-moving average overlay errors caused by gas flow issues with the support structure MT, as discussed above.

Figure 6A:
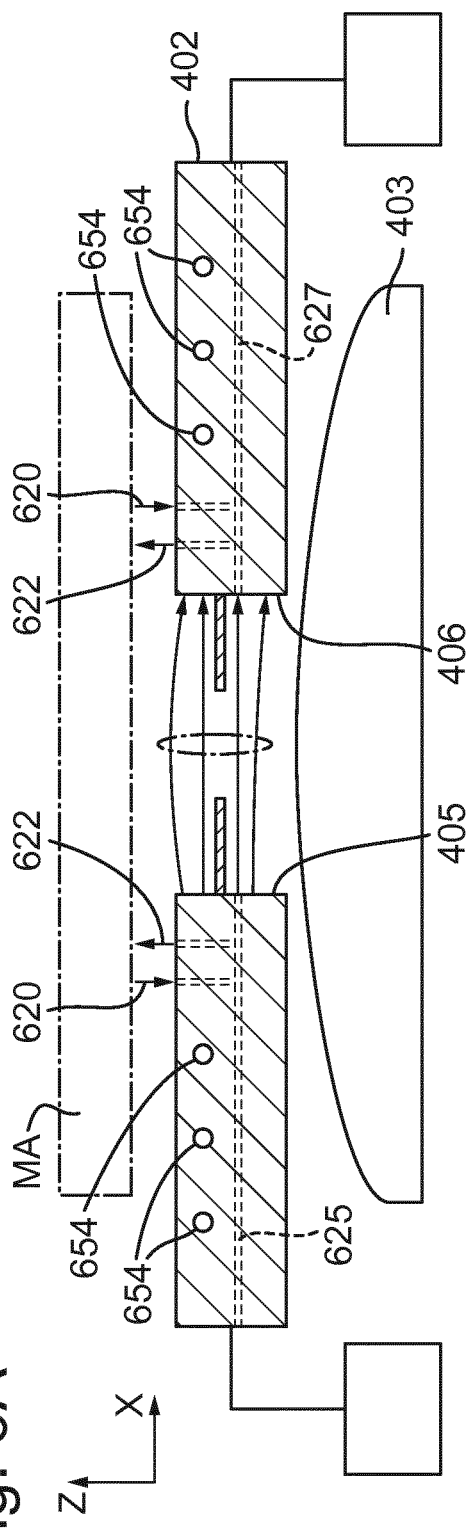
FIG. 6A depicts components around a patterning device of a lithographic apparatus.

FIG. 6A illustrates a cross sectional view of the components around a patterning device MA in a lithographic apparatus LA according to a known technique. The support structure MT is similar in structure and function to the support structure MT described with reference to FIGS. 3 and 4A to 4C. The support structure MT may have a non-flat bottom surface or a flat bottom surface as illustrated in FIG. 6A.

The plate 402 includes an opening having sidewalls 405 and 406 that are substantially parallel to each other and substantially perpendicular to a scanning direction (e.g., X-direction) of support structure MT. The plate 402 further includes gas channels terminating at openings on sidewalls 405 and 406.

The geometry of the sidewalls 405 and 406 helps to create a gas flow pattern across the opening that is perpendicular to the optical axis and parallel to a scanning direction of support structure MT. Formation of the gas flow pattern across the opening may include supplying of a gas, i.e. purge gas, through openings on one of the sidewalls 405, and extracting the supplied gas and/or non-conditioned gas through openings on the other of the sidewalls 406. The gas flow pattern may help to mitigate problems relating to, for example, a gas flow having vertical flow components, as discussed above.

It should be noted that even though the gas flow pattern is shown to be along X-axis scanning direction, gas flow patterns may be created along Y-axis scanning direction between another pair of oppositely facing sidewalls of the opening that are substantially perpendicular to the shown sidewalls 405 and 406 in FIG. 6A.

In another example, the plate 402 may include gas extraction paths in its upper surface through which non-conditioned gas that is transported into the LTE volume (as described above with respect to FIGS. 5A to 5C) may be extracted in a direction illustrated by arrows 620.

In another example, the plate 402 may include gas supply paths terminating at openings on the upper surface of the plate 402 that direct a gas through the upper surface of the plate 402, as shown by arrows 622. This gas flow is provided in order to block, and/or deflect, non-conditioned gas from entering the part of LTE volume through which the radiation beam B passes. Fluid channels 625 and 627 provide flow paths of gas through the plate 402 as required to support all of the gas outlets and inlets.

The plate 402 may further include fluid channels 654 running through the plate 402 in the Y-direction as illustrated in FIG. 6A. Fluid channels 654 may be configured to carry thermally conditioned fluid (e.g., liquids or gas) to help regulate a temperature of the plate 402 to a desired temperature. Temperature regulation of the plate 402 may include absorbing excess heat by the thermally conditioned fluid from the plate 402. Excess heat may have transferred to the plate 402, e.g., by convection or by radiation, from, for example, support structure MT, projection system PS, and/or other systems of lithographic apparatus LA during their operation. Presence of excess heat in the plate 402 may undesirably heat up the conditioned gas flowing through gas channels and gas paths and lead to overlay errors. Even though fluid channels have been illustrated along the Y-direction, it is understood by a skilled artisan that fluid channels may be oriented along different directions in the plate 402.

The lithographic apparatus LA may further include a gas system and a fluid conditioning system coupled to the plate 402. The gas system may be configured to provide gas supply through the plate 402 via, for example, channels and supply paths as described above. Additionally or alternatively, gas system may be configured to provide gas extraction via, for example, channel and extraction paths as described above.

Fluid conditioning system may be configured to provide a constant or controlled, varying flow of a thermally conditioned fluid through fluid channels 654 of the plate 402 to regulate the temperature of the plate 402. The fluid is conditioned to a desired temperature by fluid conditioning system before entering the plate 402.

The plate 402 may include slit reducers. The slit reducers are preferably positioned at about half the height of the opening but may be positioned at anywhere along the sidewalls of the opening. The radiation beam B passing through opening may be shaped and trimmed using the slit reducers.

Figure 6B:
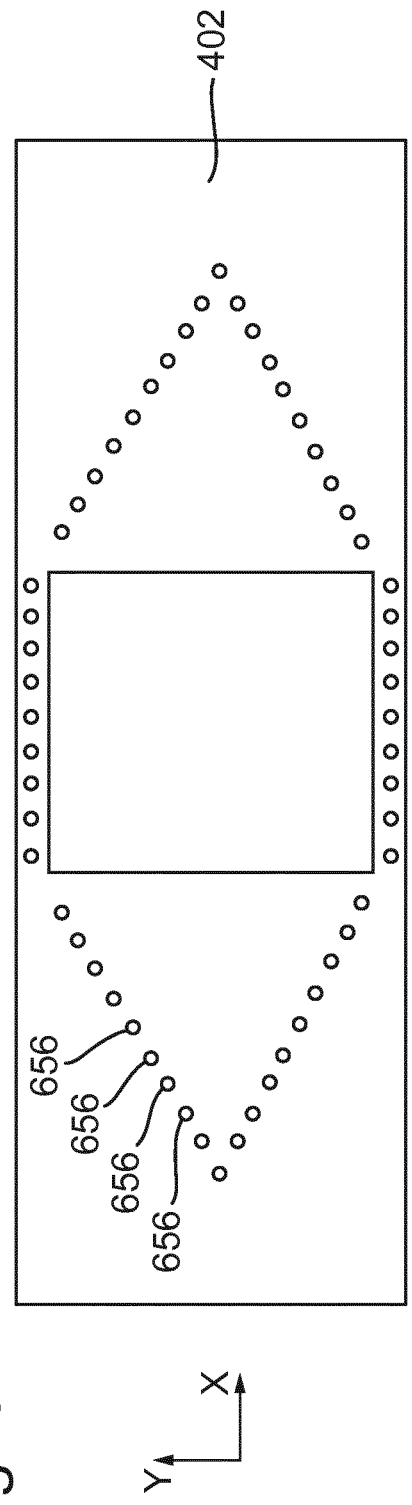
FIG. 6B depicts the top surface of a plate in a lithographic apparatus.

FIG. 6B illustrates a top view of the plate 402 that can be implemented as part of a lithographic apparatus LA. The plate 402 includes openings 656 on its upper surface, that faces the bottom surface of a patterning device MA. Openings 656 may be configured as outlets of gas supply paths (not shown) running through the plate 402.

The openings 656 are arranged in substantially V-shaped arrays with each V-shaped array being located on either side of opening of the plate 402. Such V-shaped arrays allow blocking and/or deflecting of non-conditioned gas from entering the part of the LTE volume through which the radiation beam B passes. Additionally or alternatively, the plate 402 may include similar V-shaped arrays of gas extraction path inlets (not shown) on its upper surface.

The above-described known techniques for controlling the gas flows around a patterning device MA are described in WO2014/128232A1, the entire contents of which are incorporated herein by reference.

Figure 7:
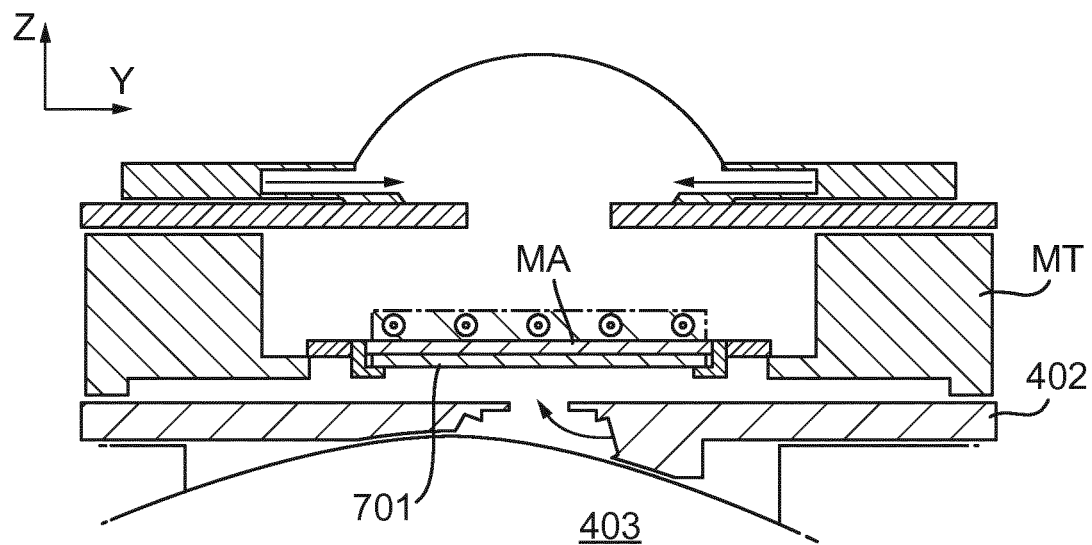
FIG. 7 depicts components around a patterning device of a lithographic apparatus.

FIG. 7 is a cross-section of another known implementation of the components around the patterning device MA in a lithographic apparatus LA. In FIG. 7, the shape of the vertical cross-section of the opening in the plate 402 is different from that shown in FIGS. 4, 5A, 5B, 5C and 6A and the relative positions of the opening and lens top 403 of the projection system PS is also different. FIG. 7 also shows the lower part of the illumination system IL. However, the structure shown in FIG. 7 operates in substantially the same manner as that described in FIGS. 4, 5A, 5B, 5C and 6A, in that a radiation beam B generated in the illumination system IL passes through the patterning device MA, through the plate 402 and into the projection system PS.

As shown in FIG. 7, the components around the patterning device MA include labyrinth bars provided on each side of the support of the patterning device MA. Provided below the lower surface of the patterning device MA is a pellicle 701.

Figure 8:
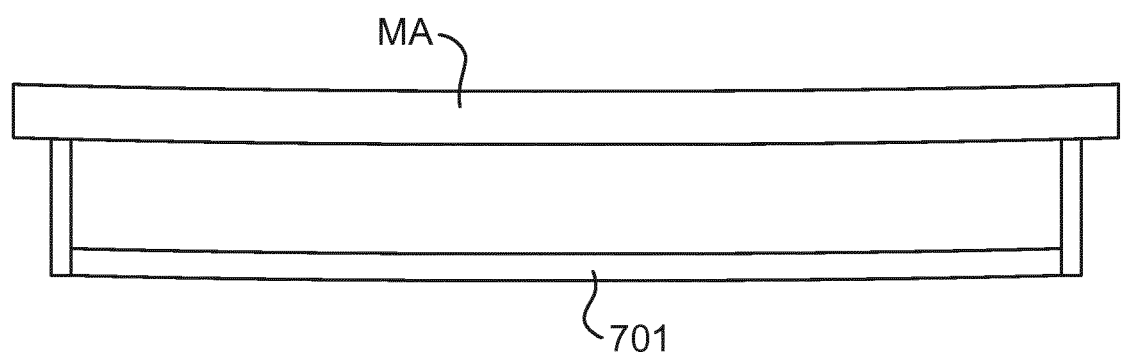
FIG. 8 depicts a patterning device with a pellicle.

FIG. 8 shows the patterning device MA, and pellicle 701 of the patterning device MA, in more detail. Pellicle supports attach the pellicle 701 to the main body of the patterning device MA. The purpose of the pellicle 701 is to keep particles away from the surface of the patterning device MA.

The pellicle 701 is positioned in the optical path of the radiation beam B and is therefore a potential cause of overlay error. The error caused by the use of a pellicle 701 is referred to as the pellicle fingerprint. Pellicle fingerprint depends on:

The physical properties of the pellicle 701;
The flow environment and geometry around the support structure MT;
The scanning speed of the support structure MT;
The acceleration and timing of the support structure MT;
The scan length; and
The scan direction.

Any movement of the patterning device MA can cause pressure gradients that deform the pellicle 701 and thereby increase the overlay errors.

A problem with the above-described techniques in all of FIGS. 4, 5A, 5B, 5C, 6A, 6B and 7 is that the gas flows are not arranged and controlled in a way that substantially minimises the overlay error that is caused by the gas flows in the LTE volume.

In FIG. 7, a purge gas is input into the LTE volume by gas outlet on one side of the opening but not extracted through gas outlets on the other side of the opening. There is therefore a substantial gas flow through the top of the opening onto the pellicle 701. Although this may reduce non-MA overlay error, caused by purge gas mixing with non-conditioned air, the substantial gas flow onto the pellicle 701 deforms the pellicle 701 and therefore increases the overlay error. In addition, there is a substantial gas flow through the opening that is parallel to the radiation beam B and this can be a greater contributor to overlay error than a gas flow that is orthogonal to the radiation beam B.

In FIG. 6A, the gas flows have been designed so that there are gas flows out of the upper surface of the plate 402, represented by arrows 622, that block non-conditioned gas during the scanning of support structure MT, as described above with respect to FIGS. 5A to 5C. However, these gas flows 622 out of the upper surface of the plate 402 flow directly onto the pellicle 701 and deform the pellicle 701. The gas flows out of the top of the plate 402 therefore increase the overlay error.

Figure 9A:
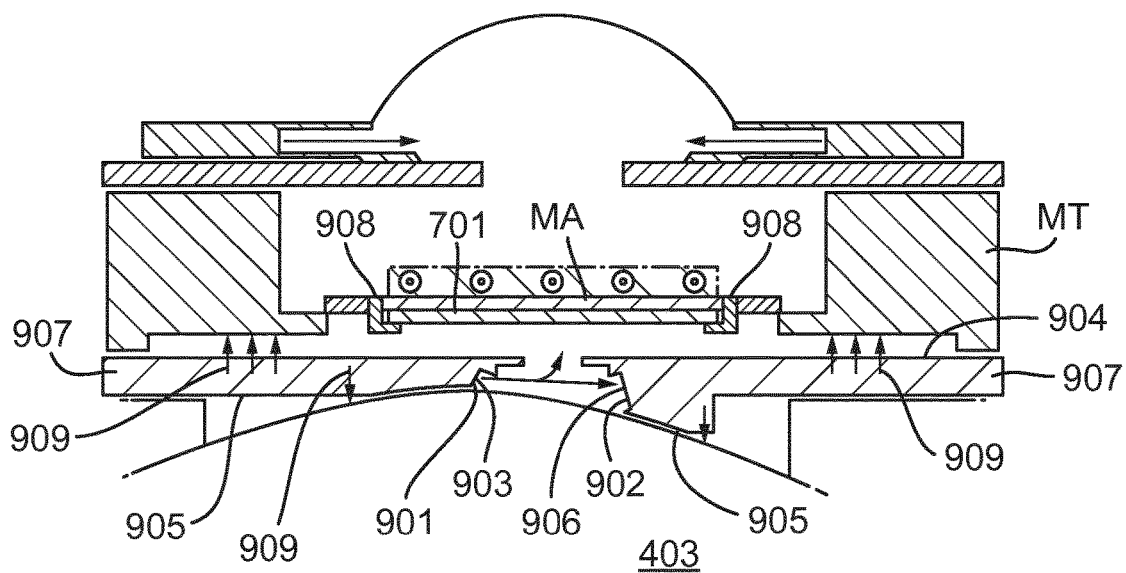
FIG. 9A depicts components around a patterning device of a lithographic apparatus according to a first embodiment.
Figure 9B:
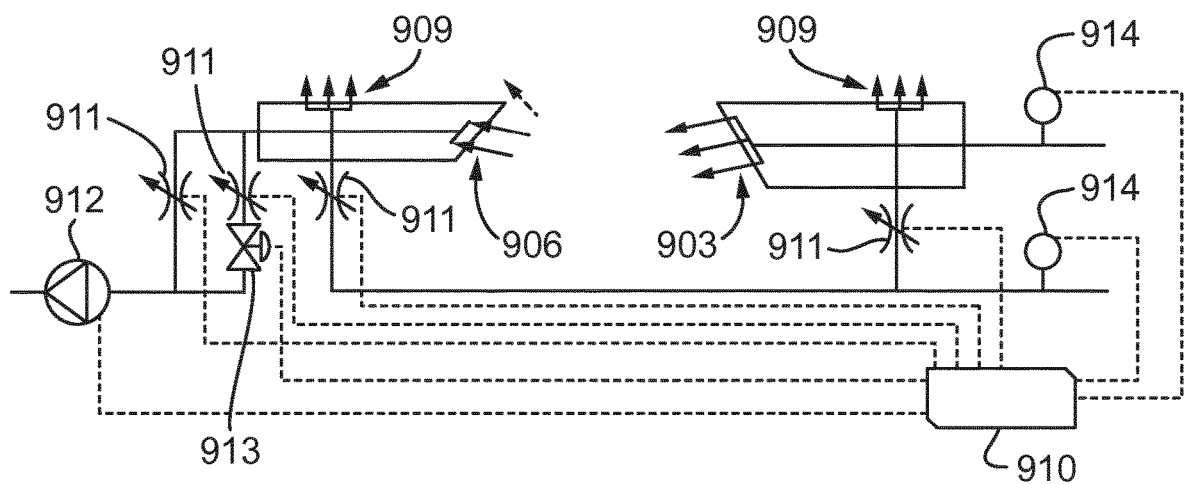
FIG. 9B depicts a control system and components for controlling gas flows according to the first embodiment.

FIGS. 9A and 9B show a first embodiment of the invention.

FIG. 9A is a vertical cross-section showing the components around a patterning device MA according to the first embodiment. The configuration in FIG. 9A differs from the above-described known techniques in both how the gas flows are provided and how the gas flows are controlled.

The configuration according to the first embodiment is similar to the known configuration shown in FIG. 7 in that there is a pellicle 701 supported below the main body of the patterning device MA, the opening of the plate 907 has a similar vertical cross-section and the relative positions of the illumination system IL, opening and lens top 403 of the projection system PS are substantially the same. Adjacent to each of a first side of the patterning device MA and a second side of the patterning device MA, that is opposite the first side of the patterning device MA, is a labyrinth bar 908.

A substantial difference between the configuration according to the first embodiment and the known configuration shown in FIG. 7 is that there is a flow path of gas across the opening, from gas outlets 903 in the first sidewall 901 to gas inlets 906 in the second sidewall 902. That is to say, according to the configuration of the first embodiment, a first sidewall 901 on one side of the opening has gas outlets 903 that supply a gas, i.e. a purge gas, into the LTE volume and a second sidewall 902, on the opposite side of the opening, has gas inlets 906 for extracting gas from the LTE volume. Advantageously, the amount of gas flowing onto pellicle 701 is decreased, the pellicle 701 deformation is reduced and the overlay error is reduced.

Another substantial difference between the configuration according to the first embodiment and the known configuration shown in FIG. 7 is that is that gas flows are provided out of one or more gas outlets 909 in the upper surface 904 of the plate 907. The gas flows out of the upper surface 904 increase the pressure in the LTE volume and thereby substantially prevent gas flows from an external environment into the LTE volume. In addition, the vertical gas flows in the part of the LTE volume through which the radiation beam B passes are reduced. The gas flowing out of the gas outlets 909 is also better conditioned than gas further away from the opening. Any gas that is transported into the part of the LTE volume through which the radiation beam B passes is therefore similar to the purge gas that is supplied directly into the LTE volume.

The configuration according to the first embodiment preferably also has gas flows out of gas outlets 909 in the lower surface 905 of the plate 907.

As shown in FIG. 9A, the first sidewall 901 of the opening, that comprises gas outlets 903, has a smaller depth in a vertical cross-section than the second sidewall 902, on the opposite side of the opening, that comprises the gas inlets 906.

Embodiments include the gas flow across the opening being from the first sidewall 901 to the second sidewall 902, i.e. from left-to-right as shown in FIG. 9A, or from the second sidewall 902 to the first sidewall 901.

Embodiments include there being either one gas outlet 903 or a plurality of gas outlets 903 in the first sidewall 901. Embodiments include there being either one gas inlet 906 or a plurality of gas inlets 906 in the second sidewall 902.

The configuration according to the first embodiment may only have gas outlets 909 on the upper surface 904 of the plate 907 and not have gas inlets on the upper surface 904 of the plate 907. The configuration according to the first embodiment may only have gas outlets 909 on the lower surface 905 of the plate 907 and not have gas inlets on the lower surface 905 of the plate 907. However, embodiments also include gas inlets being provided, such as 620 (as shown in FIG. 6A) and 1102 (as described later with reference to FIG. 11).

Preferably, the upper surface 904 of the plate 907 according to the first embodiment is substantially planar.

Preferably, along an axis parallel to the direction of the radiation beam B through the opening, the length of the first sidewall 901 of the opening is less than the length second sidewall 902 of the opening.

Preferably, the opening in the plate 907 is wider at the lower surface 905 of the plate 907 than at the upper surface 904.

Preferably, the plate 907 comprises one or more fluid channels running through the plate 907 that carry a thermally conditioned fluid for temperature regulation of the plate 907.

The gas that flows out of the gas outlets 909 in the upper surface 904 and lower surface 905 of the plate 907 may be referred to as a predilution gas. The predilution gas advantageously increases the pressure of the LTE volume. The gas that flows out of the gas outlets 903 in the first sidewall 901 may be referred to as a purge gas. The predilution gas and purge gas are preferably the same, have the same properties (temperature, etc.), and are obtained from the same gas source. The predilution gas and purge gas are supplied to the gas outlets 903 and 909 via channels in the plate 907. The predilution gas flowing out of the gas outlets 909 is better conditioned than gas further away from the opening. Any gas that is transported into the part of the LTE volume through which the radiation beam B passes is therefore similar to the purge gas that is supplied directly into the LTE volume.

As shown in FIG. 9B, a control system 910 is provided that is arranged to control one or more actuated flow restrictors 911, extraction fans 912, diaphragm pumps 913, mass flow controllers 914 and valves (not shown) that are connected to the gas inlets 906 and/or gas outlets via channels. The control system controls the flow rates of the predilution gas and purge gas. The arrangement of flow restrictors 911, extraction fan 912, diaphragm pump 913 and mass flow controllers 914 in FIG. 9B is exemplary and embodiments include other arrangements of components, and the use of additional components, for controlling the gas flows.

A substantial difference between the configuration according to the first embodiment and the known configuration shown in FIG. 6A is the positioning of the gas outlets 909 in the upper surface 904 of the plate 907. According to the configuration according to the first embodiment, the gas outlets 909 are positioned so that none of the gas outlets 909 is positioned directly below the pellicle 701 of the patterning device MA. As shown in FIG. 9A, the gas outlets 909 in the upper surface 904 of the plate 907 are located below a part of the support structure MT and are not below, or in the immediate vicinity of, the pellicle 701. That is to say, all of the gas outlets 909 in the upper surface 904 of the plate 907 are positioned and configured such that, for each of the gas outlets 909, a line that is both orthogonal to the upper surface 904 and intersects the gas outlet 909 does not intersect the patterning device MA at any point during the entire range of movement of the patterning device MA. Advantageously, this positioning of the gas outlets 903 decreases the deformation of the pellicle 701 compared to the positioning as shown in FIG. 6A.

Figure 10:
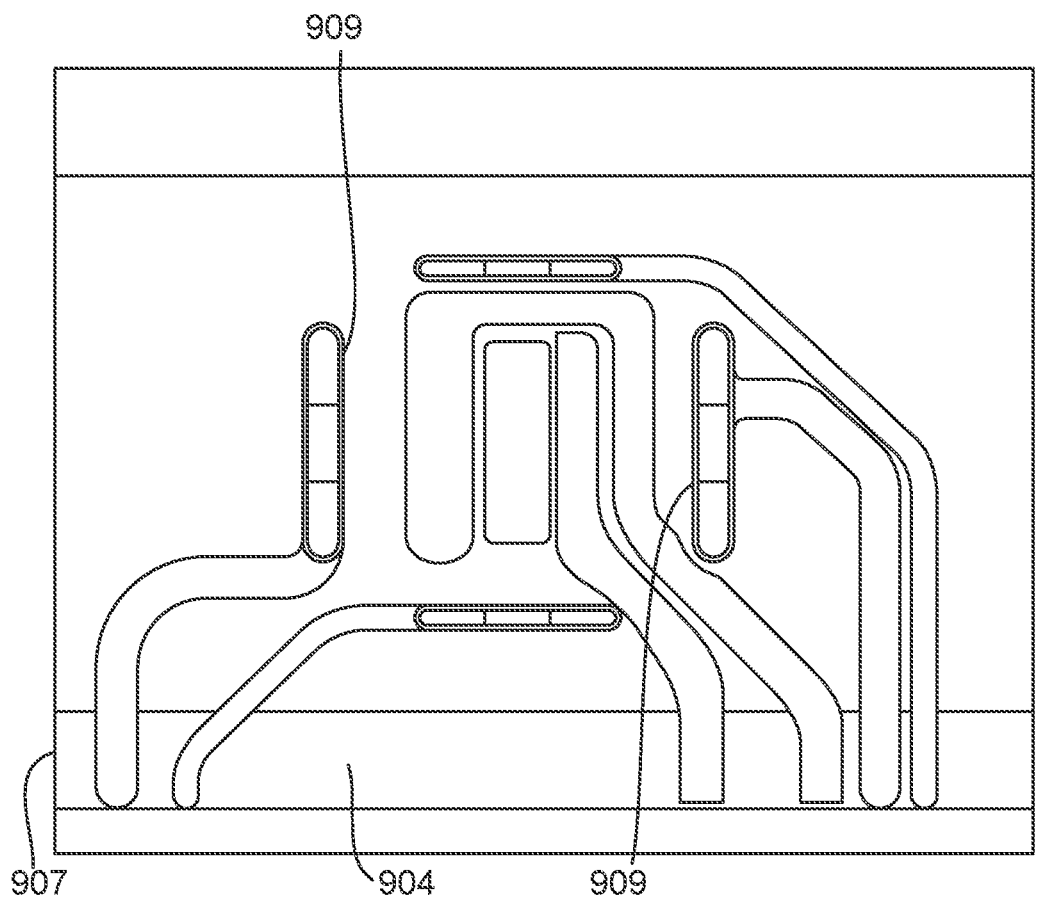
FIG. 10 depicts the top surface of a plate in a lithographic apparatus according to the first embodiment.

FIG. 10 shows another difference between the configuration of the first embodiment and the known technique shown in FIG. 6B. The gas outlets 909 in the upper surface 904 of the plate 907 are linear slots instead of nozzles. The linear slots are preferably aligned orthogonal to the scanning direction. In an alternative implementation of the first embodiment, the gas outlets 909 in the upper surface 904 of the plate 907 are provided by holes or a microsieve, i.e. laser drilled membrane. The gas outlets 909 are preferably aligned orthogonal to the scanning direction.

Another difference between the first embodiment and all of the other above-described known techniques is how the gas flows are controlled. One or more control systems 910 are provided that are arranged to control one or more actuated flow restrictors 911, extraction fans 912, diaphragm pumps 913, mass flow controllers 914 and valves that are connected to the gas inlets 906 and/or gas outlets via channels such that the gas flows through all of the gas outlets 903 and 909, and gas inlets 906, can be controlled.

According to the first embodiment, the gas flows are preferably controlled such that the extraction of gas through the second sidewall 902 of the opening is at a smaller rate than the rate at which gas is supplied through the first sidewall 901 of the opening. Preferably, the rate at which gas is extracted through the second sidewall 902 is only slightly less than the rate that gas is supplied through the first sidewall 901. By controlling the gas flows in this way, a small fraction of the supply flow will flow upwards through the opening towards the pellicle 701. Advantageously, this thermally conditions the part of the LTE volume close to the pellicle 701. This improves the focus performance and reduces the overlay error. In addition, the environment around the pellicle 701 is cleaner than when the above-described known techniques are used. A small gas flow onto the pellicle 701 can also reduce the deformation of the pellicle 701.

When the lithographic apparatus LA is operated with the extraction of gas through the second sidewall 902 of the opening controlled to be at a smaller rate than the rate at which gas is supplied through the first sidewall 901 of the opening, a first proportion of the gas that flows out of gas outlets 903 in the first sidewall of the opening flows directly to gas inlets 906 in the second sidewall 902 of the opening in a flow path that is substantially orthogonal to the direction of the radiation beam B through the opening. A second proportion of the gas that flows out of the one or more gas outlets 903 in the first sidewall 901 of the opening flows towards the upper surface 904 of the plate 907. Preferably, the one or more control systems 910 are configured to control the gas flows such that the ratio of the first proportion to the second proportion is between 0.99:0.01 and 0.5:0.5.

Preferably, the one or more control systems 910 are configured to generate different rates of gas flows into and out of the LTE volume depending on the application. That is to say, there is a first rate of gas flows out of the gas outlets 903 and 909, and into the gas inlets 906, when the apparatus is used for sensor measurements and a second rate of gas flows out of the gas outlets 903 and 909, and into the gas inlets 906, when the apparatus is used for scanning and exposure, wherein the first rate of gas flows is different from the second rate of gas flows.

Figure 11:
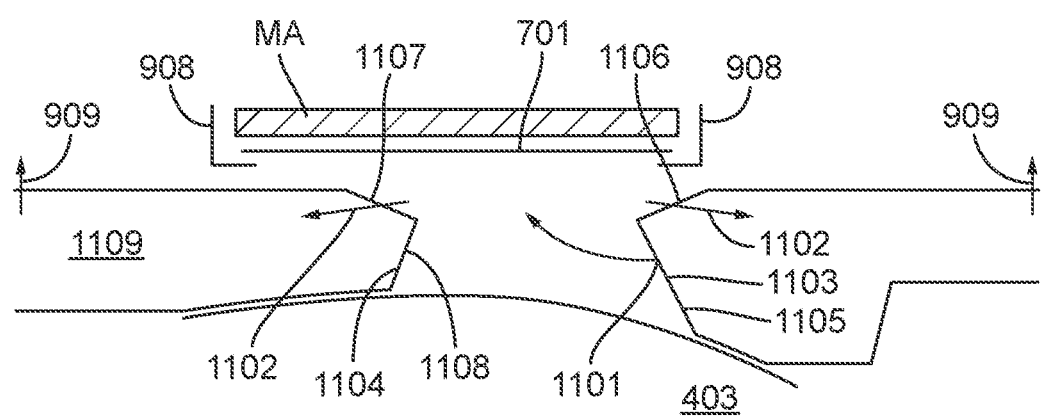
FIG. 11 depicts components around a patterning device of a lithographic apparatus according to a second embodiment.

FIG. 11 is a vertical cross-section showing the components around a patterning device MA according to a second embodiment.

The second embodiment differs from the first embodiment and the above-described known techniques in how the sidewalls of the opening are shaped and/or by both of the sidewalls comprising gas inlets. The techniques of the second embodiment may be applied in addition to, or as alternatives to, any of the techniques according to the first embodiment.

The movement of the support structure MT during a scanning operation can be summarised as having a scan-in phase, scan-middle phase and an end-of-scan phase. The second embodiment is directed in particular to reducing the pellicle 701 deformation at the scan-middle and end-of-scan phases so as to reduce overlay errors.

According to the first embodiment, only gas outlets 903 for the purge gas are provided in a first sidewall 901 and only gas inlets 906 for the purge gas is provided are provided in a second sidewall 902, opposite the first sidewall 901.

The second embodiment differs from the first embodiment by both the first sidewall 1103 comprising gas inlets 1102 and the second sidewall 1104 comprising gas inlets 1102. As shown in FIG. 11, a first sidewall 1103 comprises both gas outlets 1101 of purge gas and gas inlets 1102 of purge gas. The gas outlets 1101 in the first sidewall 1103 are positioned below the gas inlets 1102 and are adjacent to the lower surface of the plate 1109. Opposite the first sidewall 1103 is a second sidewall 1104 that comprises gas inlets 1102 but no gas outlets. On both sidewalls 1103, 1104 of the opening the gas inlets 1102 are provided adjacent the upper surface of the plate 1109.

According to the second embodiment, the opening is preferably also shaped so that it is more aerodynamic given the gas flows through and near the opening. As shown in FIG. 11, in a vertical cross section the opening, each sidewall 1103, 1104 of the opening has a first section, i.e. 1106 in the first sidewall 1103 and 1107 in the second sidewall 1104, in which the opening gradually narrows from the upper surface of the plate 1109 downwards to a minimum width, or diameter, of the opening. Each sidewall 1103, 1104 of the opening also has a second section, i.e. 1105 in the first sidewall 1103 and 1108 in the second sidewall 1104 along which the opening gradually increases in width. In a vertical cross section of the opening, the minimum width of the opening is therefore at a position between the upper surface and the lower surface of the plate 1109 and the opening is not at its narrowest at either the upper surface or the lower surface. The width of the opening at the upper surface is preferably between 10% and 70% larger than the minimum width of the opening.

The surface of the first section 1106, 1107 of each sidewall 1103, 1104 is oblique relative to the upper surface of the plate 1109. The surface of the second section 1105, 1108 of each sidewall 1103, 1104 is preferably oblique relative to the corresponding first section 1106, 1107 of each sidewall 1103, 1104. The surface of the second section 1105, 1108 of each sidewall 1103, 1104 is preferably oblique relative to the lower surface of the plate 1109. Preferably, all of the corners between the upper surface of the plate 1109 and the first section 1106, 1107 of each sidewall 1103, 1104, the first section 1106, 1107 of each sidewall 1103, 1104 and the second section 1105, 1108 of each sidewall 1103, 1104 and the second section 1105, 1108 of each sidewall 1103, 1104 and the lower surface are rounded.

All of the above features of the second embodiment improve the aerodynamics of the opening in since they reduce the generation of turbulence in the gas flows. The aerodynamic shaping also increases the volume of the opening and this advantageously reduces the pressure gradients of the gas within the LTE volume. In particular, at the end-of-scan phase according to known techniques, there is a flow separation behind the corner that connects the opening into which purge gas is supplied and the region between the pellicle 701 and the upper surface of the plate. The flow separation is caused due to flow bending behind a sharp corner, i.e. the edge between the opening and the upper surface of the plate. The flow separation generates a vortex that pushes flow towards the pellicle 701. Moreover, the shape of the edge between the opening and the upper surface of the plate 1109 generates an expansion fan with a consequent pressure variation. All of these effects can result in a deformation of the pellicle 701. By shaping the opening according to the second embodiment, and distributing the gas outlets 1101 for supplying the purge gas and the gas inlets 1102 for extracting the purge gas from the LTE volume, the vortex is prevented, or substantially reduced, and the expansion fan is also less steep.

Preferably, the gas inlets 1102 are provided in the first section 1106, 1107 of each sidewall 1103, 1104 and the gas outlets 1101 are provided in the second section 1105 of the first sidewall 1103 so that the gas extraction is not immediately above the lens top 403.

In FIG. 11, the second sidewall 1104 is shown on the left and the first sidewall 1103 is shown on the right. The gas outlets 1101 may alternatively be provided in the second sidewall 1104 instead of the first sidewall 1103, so that gas flows out of the sidewall on the left instead of the sidewall on the right.

The second embodiment includes either the second section 1105 of the first sidewall 1103 comprising a single gas outlet or a plurality of gas outlets. Each of the first section 1106 of the first sidewall 1103 and the first section 1107 of the second sidewall 1104 may either comprise a single gas outlet or a plurality of gas outlets.

The features of the second embodiment advantageously provide gas flows that improve performance. The gas flows reduce the pellicle 701 deformation and other errors since the gas extraction is not immediately above the lens top 403 of the projection system PS. The circulation of the gasses within the LTE volume is also improved and the refreshing of the purge gas is improved.

The second embodiment preferably also has a flow of predilution gas out of gas outlets 909 in at least the upper surface of the plate 1109 as described for the first embodiment. The gas outlets 909 for the predilution gas are again positioned so that the predilution gas does not flow directly onto the patterning device MA, as described for the first embodiment.

The second embodiment also comprises one or more control systems 910, valves 911 and variable speed fans for controlling all of the gas flows out of the gas outlets 1101, and all of the gas flows into the gas inlets 1102, as described for the first embodiment. The gas flows are preferably time dependent and varied during operation in order to optimise performance.

As shown in at least FIG. 9A, labyrinth bars 908 are provided symmetrically on either side of the patterning device MA. There is a upper cavity above the patterning device MA and below the end of the illumination system IL. Due to the movement of the support structure MT during operation, there can be gas flows from the upper cavity downwards. A function of the labyrinth bars 908 is to deflect these gas flows so that they do not flow through the opening to the lens top 403. Such gas flows would mix with the purge gas and the mix of gasses with different temperatures and other properties would decrease performance. The labyrinth bars 908 also shield the patterning device MA from gas flows caused by the horizontal, i.e. x and/or y direction, movement of the support structure MT during scanning operations.

Figure 12A:
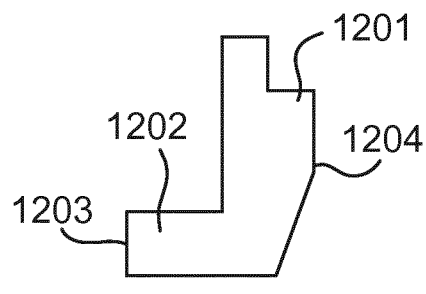
FIG. 12A depicts a cross-section of a known design of labyrinth bar.

FIG. 12A shows an end-on cross-section of a known design of labyrinth bar, i.e. the cross section is in a cross-sectional plane that is orthogonal to the longitudinal axis of the labyrinth bar. FIGS. 12B to 12F show end-on cross-sections of different designs of labyrinth bars according to a third embodiment.

As shown in FIG. 9A, a least two labyrinth bars 908 are provided, each bar being adjacent to one of two opposite sides of the patterning device MA. As shown in at least FIGS. 12A to 12C, each labyrinth bar 908 has a substantially vertical upper section 1201 and a substantially horizontal lower section 1202. The part of the lower section 1202 that is directed substantially towards the patterning device MA is referred to herein as a trailing edge 1203 of the labyrinth bar 908 and the part of the upper section 1201 and lower section 1202 that are directed substantially away from the patterning device MA are referred to herein as the leading edge 1204 of the labyrinth bar 908. Depending on the direction that the support structure MT is moving, a leading edge 1204 of one the labyrinth bars 908 will be a leading edge 1204 of the support structure MT and a leading edge 1204 of the other labyrinth bar 908 will be a trailing edge 1203 of the support structure MT.

An advantage of the designs of labyrinth bar 908 according the third embodiment, as shown in FIGS. 12B to 12F, is that the labyrinth bars have improved aerodynamic properties over known labyrinth bar designs and this reduces the gas turbulence. The designs of labyrinth bars 908 according to the third embodiment are particularly effective at reducing the magnitude of errors at scan-in phase. The techniques of the third embodiment may be used in addition to, or as alternatives to, the techniques of the first embodiment and/or the second embodiment.

The third embodiment improves on known designs of labyrinth bars 908 by one or more of:
- reducing the thickness of the parts of the labyrinth bars 908;
- reshaping parts of the labyrinth bars 908 so that they are more rounded; and
- providing openings/slits in the labyrinth bars 908.

Figure 12B:
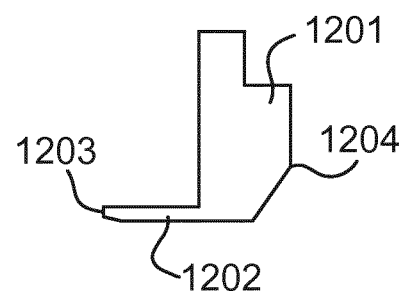
FIG. 12B depicts a cross-section of a labyrinth bar according to a third embodiment.

FIG. 12B shows an embodiment of labyrinth bar 908 in which the lower section 1202 of the labyrinth bar 908 has been reduced in thickness and tapered at its trailing edge 1203. The leading edge 1204 and trailing edge 1203 are also more rounded.

Figure 12C:
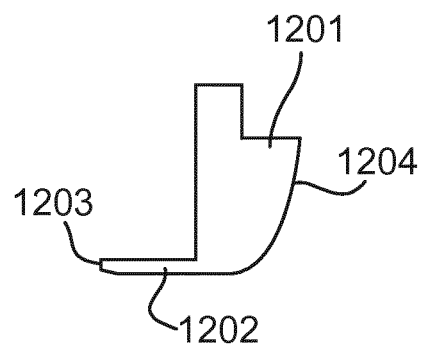
FIG. 12C depicts a cross-section of a labyrinth bar according to a third embodiment.

FIG. 12C shows an embodiment of labyrinth bar 908 in which the lower section 1202 of the labyrinth bar 908 has been reduced in thickness and tapered at its trailing edge 1203. The leading edge 1204 and trailing edge 1203 are also more rounded and the leading edge 1204 completely curved.

Figure 12D:
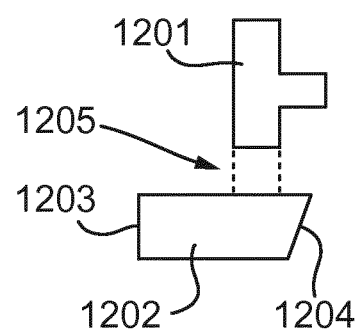
FIG. 12D depicts a cross-section of a labyrinth bar according to a third embodiment.

FIG. 12D shows an embodiment of labyrinth bar 908 in which an opening 1205, or slit, is provided between the upper section 1201 and lower section 1202 of the labyrinth bar 908.

Figure 12E:
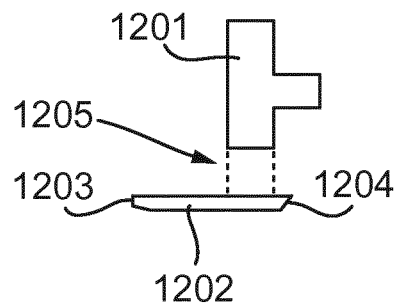
FIG. 12E depicts a cross-section of a labyrinth bar according to a third embodiment.

FIG. 12E shows an embodiment of labyrinth bar 908 in which an opening 1205, or slit, is provided between the upper section 1201 and lower section 1202 of the labyrinth bar 908. The lower section 1202 of the labyrinth bar 908 has also been reduced in thickness and tapered at its trailing edge 1203.

Figure 12F:
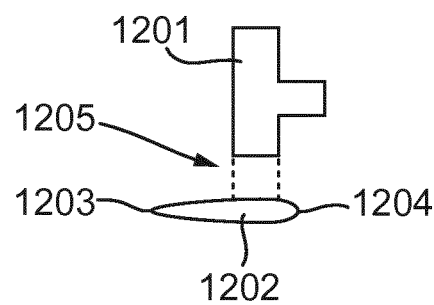
FIG. 12F depicts a cross-section of a labyrinth bar according to a third embodiment.

FIG. 12F shows an embodiment of labyrinth bar 908 in which an opening 1205, or slit, is provided between the upper section 1201 and lower section 1202 of the labyrinth bar 908. The lower section 1202 of the labyrinth bar 908 has also been reduced in thickness and tapered to a point at its trailing edge 1203. The lower section 1202 is more rounded and substantially symmetric in a cross sectional plane that is orthogonal to the longitudinal axis of the labyrinth bar 908.

Although only one labyrinth bar 908 is shown in FIGS. 12A to 12F, as described above two labyrinth bars 908 are provided. Each labyrinth bar 908 is an elongate bar that is positioned adjacent to a side of the patterning device MA and arranged to shield the patterning device MA. Each labyrinth bar 908 is adjacent to one of two opposite sides of the patterning device MA and the labyrinth bars 908 are arranged symmetrically about a midline of the patterning device MA. Each labyrinth bar 908 is arranged such that its longitudinal axis is orthogonal to both the direction of movement of the patterning device MA and an optical path of a radiation beam B through the patterning device MA. The labyrinth bars 908 according to embodiments differ from, and improve on, known labyrinth bars 908 due to their shape having improved aerodynamic properties.

Embodiments also include a number of modifications and variations to the above-described techniques.

In the second embodiment, there are gas inlets 1102 on both sides of the opening and a gas outlet 1101 on one side of the opening. Embodiments also include providing gas outlets 1101 on both sides of the opening as well as gas inlets 1102 on both sides of the opening.

Although preferred implementations of the third embodiment are shown in FIGS. 12C to 12F, embodiments also include only providing the support structure of a labyrinth bar 908 and not having a labyrinth bar 908.

In the above described first and second embodiments, the gas outlets 903 and 909 are located in a plate 907. However, the techniques of embodiments can also be used in systems that do not comprise a plate 907. For example, embodiments include the gas outlets being provided in a support structure MT, as shown in FIGS. 2 and 3.

Embodiments are provided according to the following clauses:

1. A lithographic apparatus, comprising:
   a movable stage comprising a support structure configured to support a patterning device;
   a projection system configured to project a patterned radiation beam onto a target portion of a substrate; and
   a plate positioned between the movable stage and the projection system;
   wherein the plate comprises:
   a first surface that faces the movable stage;
   a second surface that faces the projection system;
   an opening through the plate such that the patterned radiation beam passes through the opening, wherein the opening has at least a first side and a second side that extend from the first surface to the second surface;
   one or more gas outlets in the first side of the opening and one or more gas outlets in the first surface of the plate, wherein the gas outlets are configured such that gas is supplied, via the gas outlets, to a region between the movable stage and the projection system;
   one or more gas inlets in the second side of the opening, wherein the gas inlets are configured such that gas is extracted from the region between the movable stage and the projection system via the gas inlets; and
   all of the one or more gas outlets in the first surface of the plate are positioned and configured such that, for each of the one or more gas outlets, a line that is both orthogonal to the first surface and intersects the gas outlet does not intersect the patterning device at any point during the entire range of movement of the patterning device.

2. The lithographic apparatus according to clause 1, wherein the patterning device comprises a patterned part and a pellicle, wherein the pellicle is arranged between the patterned part and the plate, and/or wherein one or more gas outlets are provided in the second surface of the plate, or wherein the one or more gas outlets in the first surface comprise elongate slits.

3. The lithographic apparatus according to clause 1 or clause 2, wherein the second side of the opening is opposite the first side of the opening, and/or wherein the first side and the second side of the opening are arranged so that a direct flow path of gas from the first side to the second side is parallel to the movement direction of the movable stage, and/or wherein the first surface is substantially planar.

4. The lithographic apparatus according to any of clauses 1 to 3, further comprising one or more valve systems arranged to control of the flow of gas through the gas outlets and/or one or more gas inlets;
   one or more fan systems arranged to cause a gas flow into the one or more gas inlets; and one or more control systems arranged to control the one or more valve systems and/or one or more fan systems so as to control the gas flows through the gas outlets and one or more gas inlets.

5. The lithographic apparatus according to clause 4, wherein the one or more control systems are configured to control the gas flows such that the rate of gas flow out of the one or more gas outlets in the first side of the opening is more than the rate of gas flow into the one or more gas inlets in the second side of the opening such that:

a first proportion of the gas that flows out of the one or more gas outlets in the first side of the opening flows directly to the one or more gas inlets in the second side of the opening in a flow path that is substantially orthogonal to the direction of the patterned radiation beam through the opening; and a second proportion of the gas that flows out of the one or more gas outlets in the first side of the opening flows towards the first surface, and/or wherein the one or more control systems are configured to generate:

a first rate of gas flows out of the gas outlets and into the one or more gas inlets when the apparatus is used for sensor measurements; and a second rate of gas flows out of the gas outlets and into the one or more gas inlets when the apparatus is used for scanning and exposure;

wherein the first rate of gas flows is different from the second rate of gas flows.

6. The lithographic apparatus according to clause 5, wherein the one or more control systems are configured to control the gas flows such that the rate of gas flow out of the one or more gas outlets in the first side of the opening is greater than the rate of gas flow into the one or more gas inlets in the second side of the opening; and the ratio of the first proportion to the second proportion is between 0.99:0.01 and 0.5:0.5.

7. The lithographic apparatus according to clause 5 or clause 6 when dependent on clause 2, wherein the gas flow is controlled such that at least some of the gas flow towards the first surface is arranged to regulate the temperature of the pellicle.

8. The lithographic apparatus according to any of clauses 1 to 7, wherein, along an axis parallel to the direction of the patterned radiation beam through the opening, the length of the first side of the opening is less than the length second side of the opening, and/or wherein the separation between the first side and the second side of the opening on the first surface of the opening is less than the separation between the first and second sides of the opening on the second surface of the opening.

9. The lithographic apparatus according to clause 2, wherein the slits are arranged such that one or more of the slits are substantially parallel to the direction of movement of the movable stage.

10. The lithographic apparatus according to any of clauses 1 to 9, wherein the plate comprises a fluid channel running through the plate, the fluid channel configured to carry a thermally conditioned fluid for temperature regulation of the plate, and/or wherein the first side of the opening further comprises one or more gas inlets.

11. The lithographic apparatus according to clause 10, wherein the one or more gas inlets in the first side are provided between the first surface and the one or more gas outlets in the first side, and/or wherein the first side and the second side of the opening are rounded, and/or wherein the first side of the opening comprises a first section and a second section; wherein, along an optical path from the patterning device to the projection system, the width of the opening along the first section decreases and the width of the opening along the second section increases.

12. The lithographic apparatus according to clause 11, wherein the second side of the opening comprises a first section and a second section;

wherein, along the optical path from the patterning device to the projection system, the width of the opening along the first section decreases and the width of the opening along the second section increases.

13. The lithographic apparatus according to clause 12, wherein the gas outlets in the first side of the opening are provided in the second section of the first side of the opening; and the gas inlets in the first side of the opening are provided in the first section of the first side of the opening.

14. The lithographic apparatus according to clause 13, wherein the gas inlets in the second side of the opening are provided in the first section of the second side of the opening only.

15. The lithographic apparatus according to clause 14, wherein, for the first side and/or the second side of the opening:

the corners between the first surface and each first section are rounded; and/or the corners between each first section and each second section are rounded; and/or the corners between each second surface the second surface are rounded.

Although specific reference may be made in this text to the use of a lithographic apparatus LA in the manufacture of ICs, it should be understood that the lithographic apparatus LA described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus LA, embodiments of the invention may be used in other apparatus. Embodiments of the invention may form part of a mask inspection apparatus, a metrology apparatus, or any apparatus that measures or processes an object such as a wafer (or other substrate) or mask (or other patterning device MA). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A system for a lithographic apparatus comprising a movable stage comprising a support structure configured to support a patterning device, and a projection system configured to project a patterned radiation beam onto a target portion of a substrate, the system comprising:
   a plate configured to be positioned between the movable stage and the projection system;
   wherein the plate comprises:
      a first surface configured to face the movable stage;
      a second surface configured to face the projection system;
      an opening through the plate such that the patterned radiation beam passes through the opening, wherein the opening has at least a first side and a second side that extend from the first surface to the second surface;
      one or more gas outlets in the first side of the opening and one or more gas outlets in the first surface of the plate, wherein the gas outlets are configured such that gas is supplied, via the gas outlets, in a region between the movable stage and the projection system; and
      one or more gas inlets in the second side of the opening, wherein the gas inlets are configured such that gas is extracted from the region between the movable stage and the projection system via the one or more gas inlets,
      wherein, along an axis parallel to the direction of the patterned radiation beam through the opening, the length of the first side of the opening is less than the length of the second side of the opening.

2. The system according to claim 1, wherein one or more gas outlets are provided in the second surface of the plate, and/or wherein the one or more gas outlets in the first surface comprise elongate slits.

3. The system according to claim 1, further comprising one or more valve systems arranged to control of the flow of gas through the gas outlets and/or one or more gas inlets;
   one or more fan systems arranged to cause a gas flow into the one or more gas inlets; and
   one or more control systems arranged to control the one or more valve systems and/or one or more fan systems so as to control the gas flows through the gas outlets and one or more gas inlets.

4. The system according to claim 3, wherein the one or more control systems are configured to control the gas flows such that the rate of gas flow out of the one or more gas outlets in the first side of the opening is more than the rate of gas flow into the one or more gas inlets in the second side of the opening such that:
   a first proportion of the gas that flows out of the one or more gas outlets in the first side of the opening flows directly to the one or more gas inlets in the second side of the opening in a flow path that is substantially orthogonal to the direction of the patterned radiation beam through the opening; and
   a second proportion of the gas that flows out of the one or more gas outlets in the first side of the opening flows towards the first surface, and/or
   wherein the one or more control systems are configured to generate:
   a first rate of gas flows out of the gas outlets and into the one or more gas inlets when the apparatus is used for sensor measurements; and
   a second rate of gas flows out of the gas outlets and into the one or more gas inlets when the apparatus is used for scanning and exposure,
   wherein the first rate of gas flows is different from the second rate of gas flows.

5. The system according to claim 4, wherein the one or more control systems are configured to control the gas flows such that the rate of gas flow out of the one or more gas outlets in the first side of the opening is greater than the rate of gas flow into the one or more gas inlets in the second side of the opening; and
   the ratio of the first proportion to the second proportion is between 0.99:0.01 and 0.5:0.5.

6. The system according to claim 4, wherein the patterning device comprises a patterned part and a pellicle, and the pellicle is arranged between the patterned part and the plate and wherein the gas flow is controlled such that at least some of the gas flow towards the first surface is arranged to regulate the temperature of the pellicle.

7. The system according to claim 1, wherein the one or more gas outlets in the first surface comprise elongate slits and the slits are arranged such that one or more of the slits are substantially parallel to the direction of movement of the movable stage.

8. The system according to claim 1, wherein the first side of the opening further comprises one or more gas inlets.

9. The system according to claim 1, wherein the first side of the opening further comprises one or more gas inlets and the one or more gas inlets in the first side are provided between the first surface and the one or more gas outlets in the first side, and/or wherein the first side and the second side of the opening are rounded.

10. The system according to claim 1, wherein the first and/or second side of the opening comprises a first section and a second section;
    wherein, along an optical path from the patterning device to the projection system, the width of the opening along the first section decreases and the width of the opening along the second section increases.

11. The system according to claim 10, wherein the one or more gas outlets in the first side of the opening are provided in the second section of the first side of the opening; and
    one or more gas inlets in the first side of the opening are provided in the first section of the first side of the opening.

12. The system according to claim 11, wherein the gas inlets in the second side of the opening are provided in the first section of the second side of the opening only.

13. The system according to claim 12, wherein, for the first side and/or the second side of the opening:

the corners between the first surface and each first section are rounded; and/or the corners between each first section and each second section are rounded; and/or the corners between each second surface the second surface are rounded.

14. The system according to claim 1, wherein all of the one or more gas outlets in the first surface of the plate are positioned and configured such that, for each of such one or more gas outlets, an imaginary line that is both orthogonal to the first surface and intersects the gas outlet does not intersect the patterning device at any point during the entire range of movement of the patterning device.

15. A system for a lithographic apparatus comprising a movable stage comprising a support structure configured to support a patterning device, and a projection system configured to project a patterned radiation beam onto a target portion of a substrate, the system comprising:

a plate configured to be positioned between the movable stage and the projection system, the plate comprising:
a first surface configured to face the movable stage;
a second surface configured to face the projection system;
an opening through the plate such that the patterned radiation beam passes through the opening, wherein the opening has at least a first side and a second side that extend from the first surface to the second surface;
one or more gas outlets in the first side of the opening and one or more gas outlets in the first surface of the plate, wherein the gas outlets are configured such that gas is supplied, via the gas outlets, in a region between the movable stage and the projection system;
one or more gas inlets in the second side of the opening and one or more gas inlets in the first side of the opening, wherein the gas inlets are configured such that gas is extracted from the region between the movable stage and the projection system via the one or more gas inlets.

16. The system according to claim 15, wherein one or more gas outlets are provided in the second surface of the plate, and/or wherein the one or more gas outlets in the first surface comprise elongate slits.

17. The system according to claim 15, wherein, along an axis parallel to the direction of the patterned radiation beam through the opening, the length of the first side of the opening is less than the length of the second side of the opening.

18. The system according to claim 15, wherein all of the one or more gas outlets in the first surface of the plate are positioned and configured such that, for each of the one or more gas outlets, an imaginary line that is both orthogonal to the first surface and intersects the gas outlet does not intersect the patterning device at any point during the entire range of movement of the patterning device.

19. The system according to claim 15, wherein the first and/or second side of the opening comprises a first section and a second section;

wherein, along an optical path from the patterning device to the projection system, the width of the opening along the first section decreases and the width of the opening along the second section increases.

20. A system for a lithographic apparatus comprising a movable stage comprising a support structure configured to support a patterning device, and a projection system configured to project a patterned radiation beam onto a target portion of a substrate, the system comprising:

a plate configured to be positioned between the movable stage and the projection system, the plate comprising:
a first surface configured to face the movable stage,
a second surface configured to face the projection system,
an opening through the plate such that the patterned radiation beam passes through the opening, wherein the opening has at least a first side and a second side that extend from the first surface to the second surface,
one or more gas outlets in the first side of the opening, wherein the one or more gas outlets are configured such that gas is supplied, via the one or more gas outlets, such that the gas can flow into a path of the patterned radiation beam in a region between the movable stage and the projection system,
one or more gas inlets in the second side of the opening, wherein the gas inlets are configured such that gas is extracted from the region between the movable stage and the projection system via the one or more gas inlets; and
one or more control systems configured to control the gas flows such that the rate of gas flow out of the one or more gas outlets in the first side of the opening is more than the rate of gas flow into the one or more gas inlets in the second side of the opening such that:
a first proportion of the gas that flows out of the one or more gas outlets in the first side of the opening flows directly to the one or more gas inlets in the second side of the opening in a flow path that is substantially orthogonal to the direction of the patterned radiation beam through the opening; and
a second proportion of the gas that flows out of the one or more gas outlets in the first side of the opening flows towards the first surface.

* * * * *